United States Patent [19]

Gimblett

[11] Patent Number: 4,831,380
[45] Date of Patent: May 16, 1989

[54] TRANSDUCER INTERFACES

[75] Inventor: Christopher F. Gimblett, St. Leonards-on-Sea, United Kingdom

[73] Assignee: Drallim Industries Limited, England

[21] Appl. No.: 84,699

[22] PCT Filed: Nov. 19, 1986

[86] PCT No.: PCT/GB86/00705
§ 371 Date: Jul. 16, 1987
§ 102(e) Date: Jul. 16, 1987

[87] PCT Pub. No.: WO87/03436
PCT Pub. Date: Jun. 4, 1987

[30] Foreign Application Priority Data

Nov. 20, 1985 [GB] United Kingdom ................ 8528587

[51] Int. Cl.[4] ............................................. H03M 1/56
[52] U.S. Cl. .................................... 341/166; 341/142; 341/155; 341/169
[58] Field of Search ................ 340/347 CC, 347 NT, 340/347 AD, 347 M; 364/556, 571, 572, 573; 341/118, 126, 155, 166, 169, 172

[56] References Cited

U.S. PATENT DOCUMENTS

| 3,701,145 | 10/1972 | Bergin | 340/347 NT |
| 4,031,530 | 6/1977 | Aneshansley | 340/347 NT |
| 4,503,707 | 3/1985 | Rosa et al. | 364/556 X |
| 4,675,649 | 6/1987 | Forehand et al. | 341/166 |

Primary Examiner—William M. Shoop, Jr.
Assistant Examiner—Brian Young
Attorney, Agent, or Firm—James Creighton Wray

[57] ABSTRACT

An addressable transducer interface which may be associated with a particular electrical transducer, comprises means (107) for storing correction data for the correction of errors as herein defined relating to that transducer so that on addressing of the interface by external control means, the correction data may be transmitted to the control means together with measurement data from the transducer. The storing means is arranged to store said correction data in digital form.

The interface includes an analogue to digital converter circuit which comprises means (305, 306) for changing a capacitor (303) of a given value from a source of constant current of a given value, voltage comparator means (310, 311, 312) arranged to compare the value of an analogue voltage signal on an input with the charge voltage in said capacitor, a digital counter (301) arranged to start a count of cycles of a reference frequency when charging the capacitor is commenced from zero charge, a shift register (316, 317, 318) and a loading circuit arranged to cause the instantaneous count in said counter to be loaded into said shift register at the time when the charge in said capacitor is detected by said comparator as being equal to the value of the analogue signal.

17 Claims, 3 Drawing Sheets

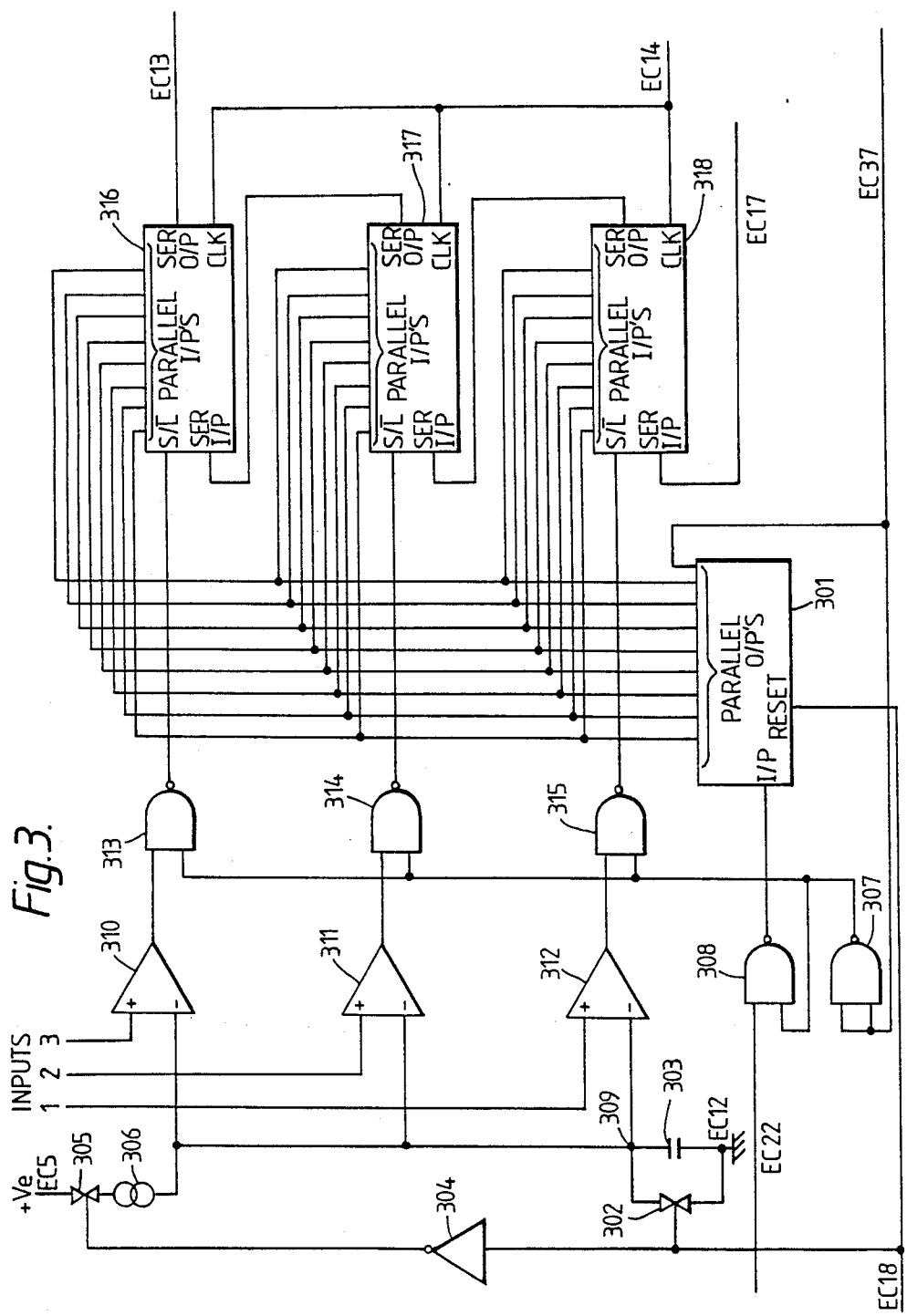

TRANSDUCER INTERFACES

This invention relates to an interface for an electrical transducer which enables measurement errors in the transducer to be corrected during use of the transducer.

In this context the term 'error' should be interpreted as any deviation or discrepancy between the measured value of the parameter under observation and its true value, the term error correction means any form of processing required to correct the measured value back to the true value i.e. signal conditioning.

Broadly speaking, transducer measurement errors fall into three classes. A. Errors produced by changes in the operating environment of the transducer e.g. changes in supply voltage, changes in temperature, changes in any environmental parameter other than that which is the primary parameter of investigation that may alter the measured value of the primary parameter. B. Errors produced by variations in characteristics of individual transducers of one class. These may be caused by spreads in manufacturing tolerances, errors in the manufacturers calibration processes, the long term effects of ageing in an individual transducer. C. Class errors, these are characteristic errors of a given class of transducer. For instance all basic thermistor type gas flow monitoring transducers have a non linear output due to the thermistor characteristics and the principle of operation. Again, most semiconductor pressure transducers exhibit a non linear response over some portion of their range due to a decrease in diaphragm compliance with increasing deviation from the resting (zero displacement) state.

In the past there have been two common methods of correcting such errors.

1. Analogue signal conditioning of the transducer either by means of components in its associated circuitry or by components forming an integral part of the transducer and adjusted by the transducer manufacturer.

2. Where the transducer is employed with a microprocessor or computer, data obtained by testing an individual transducer and relating to that transducer may be entered in the memory of the microprocessor or computer and used to correct the transducer errors whenever a reading is taken. In some cases a microprocessor may be required in proximity to the transducer to provide local corrections.

There are disadvantages to both systems, analogue signal conditioning requires that the necessary correction components are designed into the circuitry associated with the transducer and that the whole circuit (including the transducer) should be subjected to repeated cycling through the expected operating conditions in order that it may be adjusted correctly. This will increase production time and expense and unless the correction circuitry is fairly elaborate will not result in extreme accuracy.

The use of a microprocessor or computer, although allowing greater accuracy, limited only by the accuracy of the test equipment, suffers from the disadvantage that if it becomes necessary to exchange the transducer then the correction data stored in the microprocessor or computer must also be changed. In addition to this, where a number of transducers are controlled by a single microprocessor or computer it is necessary to store the relevant data for each transducer in a set of tables held by the microprocessor computer thus limiting (by the amount of memory available for this purpose) the number of transducers that a microprocessor or computer of a given size may control.

Accordingly the present invention provides an addressable transducer interface which may be associated with a particular electrical transducer, having means for storing correction data for the correction of errors as herein defined relating to that transducer so that on addressing of the interface by external control means, the correction data may be transmitted to the control means together with measurement data from the transducer.

Preferably said error correction data is stored in digital form.

Preferably the interface includes an analogue to digital convertor arranged to convert an analogue output signal of the particular transducer to digital form.

Preferably the error correction data and the transducer measurement data are transmitted to the control means in serial form.

In a further aspect the invention provides such an interface in combination with a transducer for which the error correction data is stored in said storage means.

In such an arrangement the addressable transducer interface may be addressed to give a reply containing some or all of the following items of information.

1. Its unique address to verify that the interface replying was the one that was addressed.

2. The class identity of its associated transducer to enable signal conditioning appropriate to that class to be performed for correction of class C errors.

3. Raw (unprocessed) data relating to the value being measured by the transducer.

4. Pre-encoded data for correction of class A type errors (normally another input of the A to D would be used to measure the parameter, e.g. temperature, causing the error).

5. Pre encoded data relating to the individual transducer characteristics for the correction of class B error.

By this means a common microprocessor/computer may address a variety of transducers (either local to or remote from the microprocessor/computer) and by means of the pre encoded data, identify the class of transducer, select the appropriate signal conditioning program for that class, and correct the measured value(s) as closely as possible to the true value by inserting the correction factors/data contained in the reply (from the addressed interface) into the signal conditioning program.

In a further aspect the invention provides a convertor for converting an analogue signal to a digital signal, particularly but not exclusively for use in the above arrangement, comprising means for changing a capacitor of given value from a source of constant current of a given value, comparator means arranged to compare the value of the analogue signal with the charge voltage of said capacitor, a digital counter arranged to start counting when the capacitor charging is commenced from zero charge, a shift register and a loading circuit for the shift register arranged to cause the instantaneous count in said counter to be loaded into the shift register at the time when the charge in the capacitor is detected as being equal to the analogue signal by said comparator.

Preferably a plurality of shift registers, with respective load circuits and comparator means are connected to said counter constant current source and capacitor so that a plurality of independent analogue signals may be converted to respective digital signals simultaneously. The interface may take the form of a small printed circuit board which will accept analogue or digital inputs from one or more transducers provided that these transducers have either a resistive, electrical or digital output. The required transducer(s) is fitted to the interface and run through tests simulating the operating conditions and the necessary data for correction is derived from the results of these tests. This data with any other preset data unique to the transducer is then encoded onto the transducer interface either by means of links, switches, or non volatile logic incorporated in the interface. Each time a transducer reading is taken, via the interface, the correction data is encoded along with the data from the transducer(s) and returned to the microprocessor or computer.

The data may be returned directly, where the interface and microprocessor or computer form part of an instrument or via a pair of dedicated wires or a modem or other transmission means where a microprocessor or computer is being used to control a number of transducers in a system. The transducer and interface are calibrated individually and remain together as a unit which can be fitted into a microprocessor or computer controlled instrument or system without the need to carry individual correction data on transducers in that microprocessor or computer. Transducer and interface units may be replaced or interchanged without the need to alter data held in the microprocessor or computer. The interface may be addressed directly where only one is in use or will respond to a unique address, encoded by means of switches or some such other method on the interface p.c.b. where a number of transducer and interface units are operating on a single pair of wires as part of a large system. In addition to the transducer measuring the primary quantity to be investigated a temperature transducer may be fitted to the interface and data relating to the local temperature will be encoded in addition to the primary transducer data and the correction data. Using this system cheap easily available transducers may be calibrated and using the data encoded on the interface will enable a microprocessor or computer to obtain accurate data from local or remote transducer and interface units without the need for the microprocessor or computer to hold correction data and with complete interchangeability of calibrated transducer interface units in a system without the need to change any data held by the microprocessor or computer other than address data (where relevant).

In order to promote a fuller understanding of the above and other aspects of the present invention, an embodiment will now be described, by way of example only, with reference to the accompanying drawings in which:

FIG. 3 shows a schematic diagram of an analogue to digital converter circuit which may be used in the arrangement of FIG. 1.

The embodiment to be described is an addressable transducer interface unit (a TU) designed to interface with a wide range of transducers of all types i.e. pressure, flow, temperature, humidity etc. and allow a number of TU's to be connected to a single pair of cables of up to 100 km in length which will function as common, power lines, address lines, and data return lines for all TU's. Each TU will be pre-encoded with the necessary correction data for the transducer(s) connected to it and when addressed, that is, recognises its unique preset address in the form of a pulsed 1 KHz signal on the common cable pair, will reply, via the common cable pair, with a data stream containing the current readings from its own transducers, the preencoded correction data for those transducers and its own address (in order to establish that the TU replying is the one that was addressed). During manufacture the TU's are assembled and fitted with the required type of transducers. The TU and transducer(s) are the tested as a unit and put through a temperature cycle and any other parameter cycle required by the transducers. The testing is performed under computer control and the data aquired is processed to provide a correction code unique to that TU and transducers(s) combination. This code is thenset (by means of split solder pads or cut links or switches) into the TU. In service, every time the TU is addressed (each TU is preset to its unique address) it returns a data stream that includes the unique correction code. The control unit (CU) receives the data stream from the addressed TU and processes it using the correction code to provide accurate transducer readings. The block diagram of FIG. 1 shows the functional parts of the TU each of which will be dealt with in turn.

1: ADDRESS DETECTION AND ADDRESS SHIFT REGISTER

Figure 1:
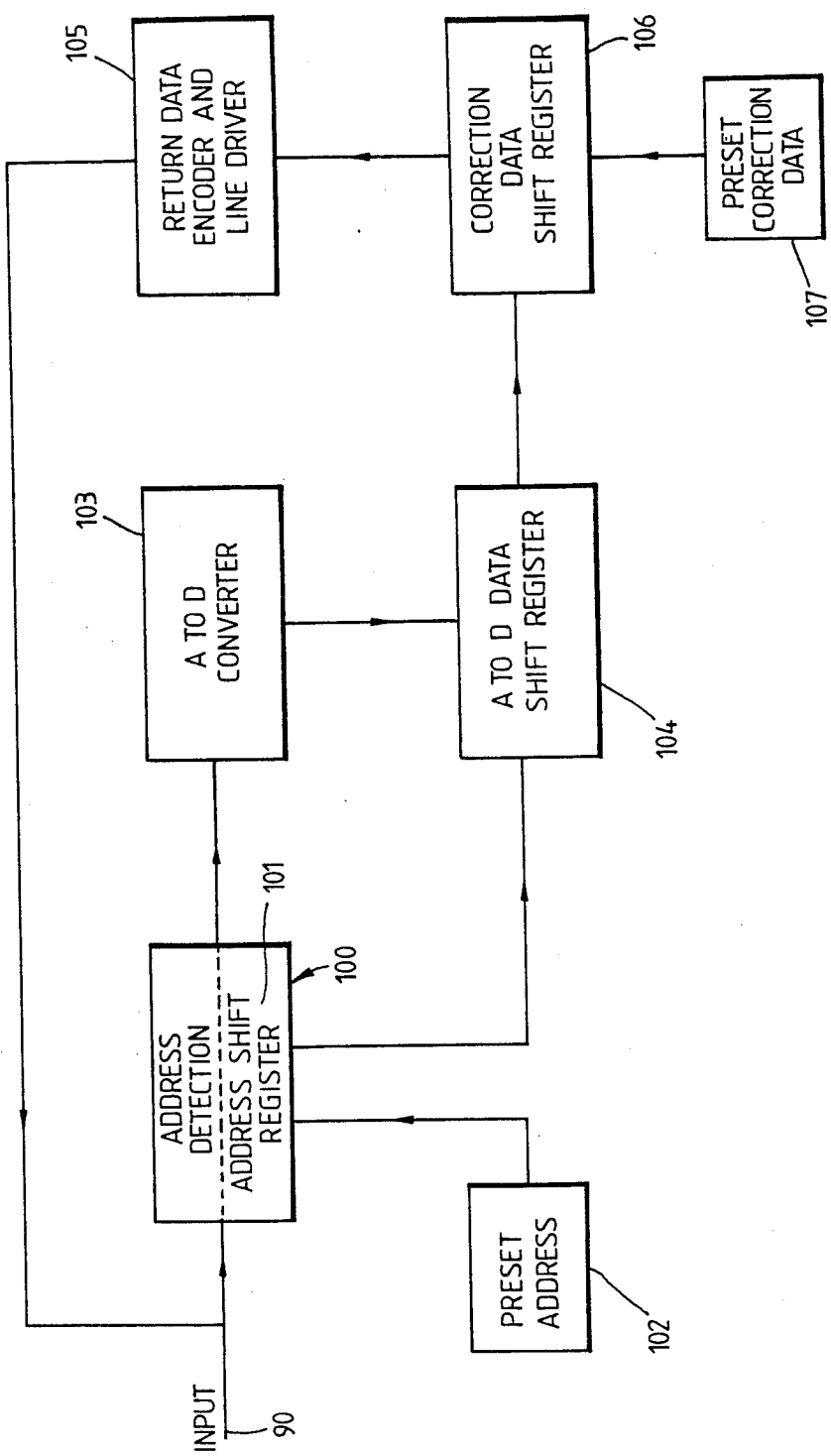
FIG. 1 shows a block diagram of an addressable transducer interface unit.

This circuit indicated generally at 100 in FIG. 1, contains a phase locked loop system which tracks a 1 kHz pilot tone provided from the CU on a common cable pair 90 and provides:

(a) An accurate frequency reference used for, system timing and the A to D converter.

(b) Reference waveforms required to decode the "Addresses", and for an address decoder and an address shift register.

When an address is received it is decoded, checked for validity i.e. checked to ensure that it is genuine and not produced by noise or interference, clocked into an address shift register 101 and compared with the unique address preset in storage means indicated at 102. If the two addresses are identical the address is "locked" into the shift register, the rest of the circuits are powered up and the measurement cycle begins during which time any further addresses are ignored. If the address is not identical to the preset address it is compared to two other preset addresses which are common to all other TU's in the system under the control of the CU. The first of these is the "Common Reset Signal". This signal resets all TU's for a time period long enough to allow the addressed TU to reply. During this period TU's ignore all data on the common line. This "Common Reset Signal" is transmitted shortly after the required "Address" has been sent. The address TU will have "locked" and will ignore the reset, perform its measurements and return its data, all other TU's reset and ignore this data. The second of the common addresses is the "switch on" signal. This is transmitted prior to the address of the required TU and TU's on receiving it will go into a "ready" state. The required TU address is then transmitted and the addressed TU will perform its normal "measure and return data" cycle and in addition will switch on (or off if already on) any item of auxiliary equipment connected to it. Since the "common Reset" signal follows the address of the required TU all other TU's will then drop out of the "ready" state and reset and normal. If the address received by any TU is genuine but does not match either that TU's preset address, the "Common Reset" signal or the "switch on" signal then it will be ignored.

Figure 2:
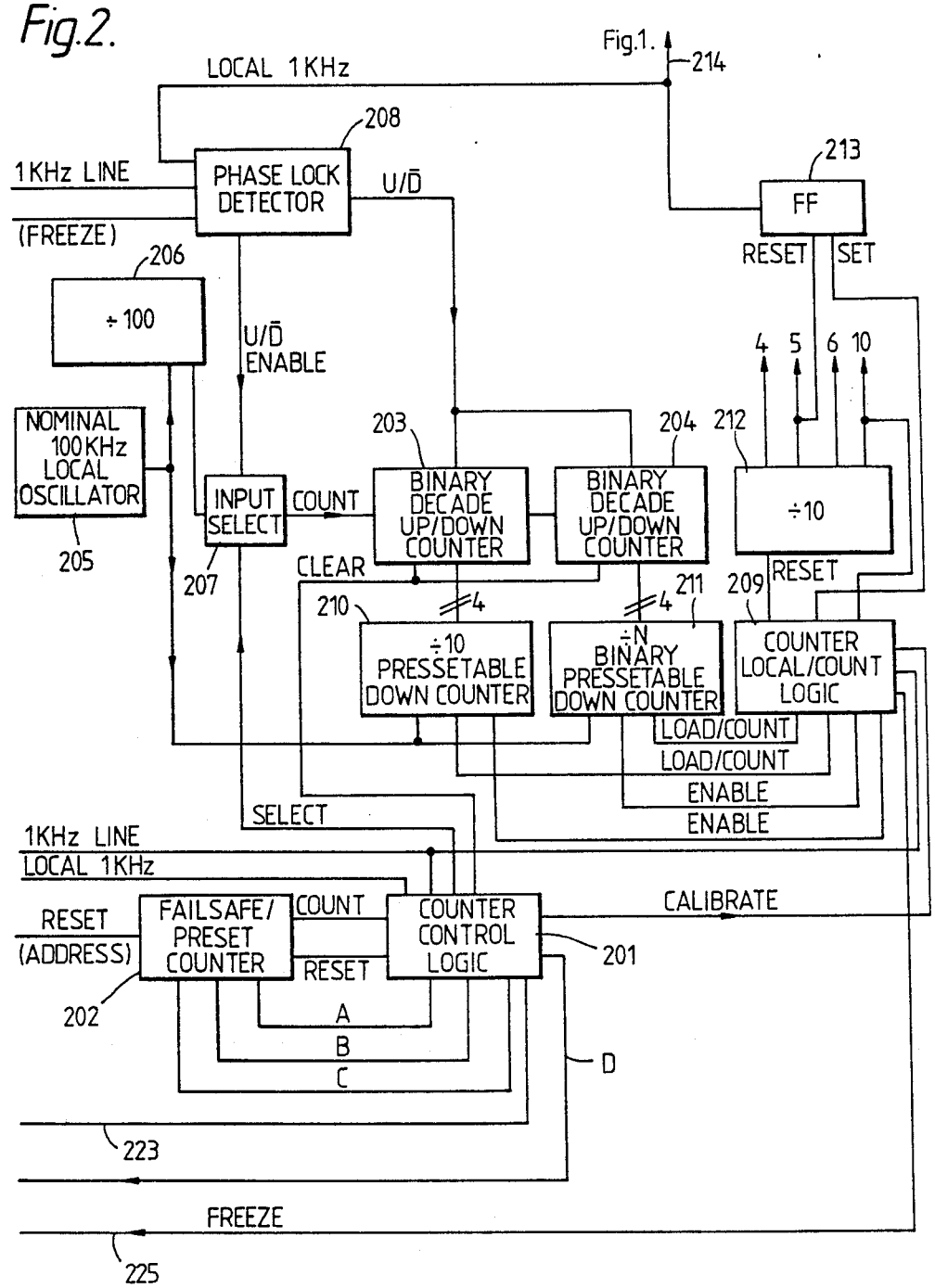
FIG. 2 shows a schematic diagram of a digital phase locked loop which may be used in the unit of FIG. 1.

A preferred form of quasi phase locked loop for use in the arrangement of FIG. 1 is shown in schematic form in FIG. 2.

As discussed above the 1 kHz line 90 carries a 1 kHz crystal controlled tone containing "addresses" encoded with a form of frequency modulation. A unique address is transmitted, followed, after a short interval, by the "common reset address". The 1 kHz crystal controlled tone is then interrupted to allow the "addressed" unit to reply. All non "addressed" units on the line have responded to the "common reset address" and ignore line signals for a preset period, nominally 2 seconds. The complete cycle of Unique Address, Common Reset Address and reply period is thus approximately 2 seconds.

In general terms this quasi-phase locked loop comprises a means for detecting phase errors between external and local frequencies, a local oscillator of fixed frequency feeding a frequency divider the division ratio of which may be altered by the phase error detector in such a way that the output of said frequency divider is at the same frequency as and in phase with the external frequency. A circuit may be included for automatically presetting the division ratio of said frequency divider, during periods when the external frequency contains no phase frequency modulated in order that the quasi phase locked loop may be automatically "returned" to any new frequency within a given range.

In FIG. 2 a counter 202 has two functions, in the "addressed" mode it starts its count (Local 1 kHz) from a control line 225 going high and in normal operation an output A does not reach a preset value corresponding to the reply period of 2 seconds before line 225 returns to a low condition and counter 202 is reset. If it does reach the reset value (approx 2 secs) while line 225 is high then the unit is in a fault mode and a "failsafe reset and power down" signal is generated on an output D.

In the quiescent (non addressed) mode counter 202 counts the 1 kHz line pulses while the preset value of an output B is set to be greater than the normal cycle time and since in this mode counter 202 is reset by pulses from 207 (the address reset signal ½ sec. reset signal), it does not time out on output B. If it does time out on output B this means that the 1 kHz tone on the line has not contained an address or been interrupted for this period, i.e. it is now a "calibrate" signal. The counter control logic now clears counters 203 and 204 and enables them to count up for a period determined by the C output of counter 202 (100 cycles of line tone), taking their count from a local oscillator 205 running at a nominal frequency of 100 kHz via a divide by 100 divider 206 and an input selector 207. At the end of this period counters 203 and 204 contain a count value equal to the number of local oscillator pulses present during a single 1 kHz pilot tone cycle (or the ratio between the required frequency for phase locking and the local oscillator frequency). As soon as the calibrate period has finished circuit 201 associated with counter 202 reverts to its role of checking for addressed or calibrate modes. During the calibrate period an output from circuit 201 is used to set a further control circuit 209 to the start of its cycle and on removal of this output, circuit 209 starts up on detecting the leading edge of the next 1kHz line pulse. Counters 203 and 204 are a ÷10 counter cascading into a ÷N binary counter 211. The value stored in counter 204 therefore represents one tenth of the total with the remnant stored in 203. When circuit 209 has loaded the counter 211 ten times with the counter value in 204 and run it down to zero each time using the local oscillator 205 it will load counter 210 with the count value in 203 and run it down once. This results in a total count of local oscillator 205 pulses equal to the value in 203 and 204 i.e. the number of local oscillator pulses equal to one cycle of 1 kHz pilot tone. Each time 211 is loaded and run down the count in a counter 212 is incremented by one (starting from zero). The "four" output of 212 is therefore approx equal to 40% (min 40% max 44% depending on "remnant" value in 203) the "five" output is approx equal to 50% (min 50% max 55%) and the "six" output approx equal to 60% (min 60% max 66%). The four and six outputs can now be used to check the FM data on the 1 kHz line and the five output is used to toggle a flip flop circuit 213 output from high to low. The ten output is detected by circuit 209 and once (210) has been run down circuit 209 toggles the flip flop 213 high again thus completing a single cycle of 1 kHz on output line 214. Phase detector 208 now checks the coincidence of leading edges of the signal on output line 214 and the 1 kHz pilot tone and if an error exists increments/decrements the value in counters 203 and 204. Provided that the local oscillator has a short term stability of ±1% per 1 m sec. period and a long term stability of ±1% per 2 sec. period (assuming a steady supply voltage and temperature during these periods) the phase locked loop will maintain lock to within ±1%. When an "address" is received or a two second reset the phase lock detector 208 is frozen for the entire reply or two second reset period. On the removal of the freeze signal circuit 209 is reset to the start of its sequence ready to start up with the leading edge of the next 1 kHz line pulse following the removal of the "freeze" signal.

The counter control logic circuit 201 determines, via line 225 whether the chip is in quiescent mode or addressed mode. In the addressed mode the control logic 201 routes local 1 kHz to the counter 202. In the quiescent mode the control logic 201 routes the 1 kHz line input to the counter 202. If the 1 kHz Line signal drops out or an addresss is received the counter 202 will reset. If the counter 202 times out on output 3 the control logic 201 will, clear the count in 203 and 204 select the 205 local oscillator input to 203 and 204 via 206 and 207, maintain the 1 kHz line input to 202 and wait for counter 202 to time out on output C (= to 100 line 1 kHz pulses). When counter 202 times out on output C, the required number for the phase locked loop is now present in 203 and 204. If a reset appears on 207 before counter 202 times out on output C the control logic 201 clears 203 and 204 and again waits for counter 202 to time out on output C. Once counter 202 has timed out on output C the control logic 201 resets 202, maintains 1 kHz line input to 202 and waits for time out on output B again/or addressed state from 25. The phase lock detector 208 compares the leading edges (low to high transition) of the 1 kHz line signal and the local 1 kHz. If the line 1 kHz precedes the local 1 kHz counters 203 and 204 are set to down count via the U/D Line and the error pulse present on the U/D enable line is fed to counters 203 and 204 via selector 207. If the local 1kHz precedes the line 1 kHz, counters 203 and 204 are set to up count via the U/D line and the error pulse present on the U/D enable is again fed to counters 203 and 204 via 207. In this way the value held in 203 and 204 is increased or decreased to maintain lock.

The Counter load/Control logic circuit 209 performs the following sequence:

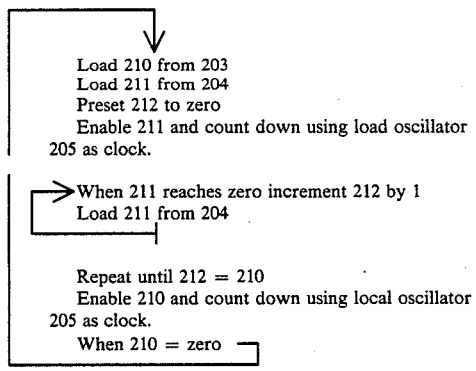

When the signal on line 225 is high indicating that the unit has been addressed the phase lock detector 203 is inhibited from further error correction. When "2 sec" reset is called detector 208 is also frozen.

Means may be provided to ensure that loading from counters 203 and 204 and error correction in these counters do not conflict.

This arrangement of FIG. 2 offers the following advantages.

(1) No setting up or adjustment of local oscillator or any part of PLL system required.

(2) In operation the PLL will track a changing signal (max rate of change 1% per cycle with respect to pulse repetition frequency) with an accuracy of better than 1% over a very wide range. (Signal range limited only by operating frequency of local oscillator).

(3) The operating frequency may be set to any point in the range by transmitting the required frequency for a period of time than two seconds.

(4) Since the system tracks and locks on the rising (low to high transition) edges of the appropriate waveforms and ignores the falling transmissions it will lock and track on waveforms containing pulse width modulation providing the pulse repetition frequency remains constant and will provide the necessary timing information for decoding the pulse width modulation. The system maintains lock despite local oscillator variations (due to temperature or voltage fluctuations) provided that the rate of change $\leq 1\%$ per cycle in the "track" mode and in the "freeze" mode will lock at the end of the "freeze" period provided that local osc. stability is better than 1% per two seconds.

2: A TO D CONVERTER

This is an A to D converter of a design embodying a further aspect of the invention. On power up (i.e. when the TU receives its unique address) the A to D 103 performs a single measurement cycle during which it converts the analogue value of a voltage present on each of its analogue inputs into digital values, simultaneously. For the requirements of this embodiment of the invention there are three analogue inputs but this A to D circuit may be arranged to measure twenty or more analogue inputs simultaneously. Each analogue input has an associated shift register 104 and the digital value related to each input is loaded into the associated shift register via its parallel inputs. These shift registers are linked in a sequential chain via their input and output ports so that the digital values of each analogue input are thus combined to form a digital "word" that can be "clocked" through and out of the shift register chain. This shift register chan is linked to the Address shift register 101 which still holds the recognised Address obtained from the decoder) and a Correction Data Shift Register chain 106 which, on power up, loads the preset correction data from storage means 107. The serial inputs and outputs are again used to link the shift registers so that the complete chain of shift registers contains a single long digital word comprising Address, A to D measurement data and preset correction. This word is clocked (serially) through and out of the shift register chain and into the "Return Data Encoder and Line Driver" 105 where the data is encoded (using a different format from that used when addressing) and transmitted back to the CU via the common cable pair. Once this has been done the TU "powers down" the measurement circuitry and reverts to monitoring the common cable pair for further addresses.

A TO D OPERATION AND DATA CORRECTION SYSTEM

In this embodiment one of the three A to D analogue inputs is wired to a reference voltage, one to a temperature transducer and the other is uncommitted. The reference voltage may be any value lying between 0 volts and the TU power supply voltage, in practice it is normally set to approximately half of the power supply voltage.

During test and calibration the required type of transducer is fitted to the uncommitted input and the required parameter is applied to that transducer to produce a "full scale" output e.g. if the required transducer is a 0-30 p.s.i. absolute pressure transducer then 30 p.s.i. absolute pressure is applied to it and the relevant digital value is aquired by a test computer from the TU. Simultaneously the reference voltage is measured and the digital value aquired. The two values are compared and expressed as a ratio which forms the first part of the correction data word. A zero input is now applied to the transducer under test e.g. 0 p.s.i. for a 0-30 p.s.i. absolute pressure transducer and again the A to D output value for this together with the reference voltage value is acquired and processed to produce a ratio which forms the second part of the correction data word. This exercise is then repeated at different temperatures and the values of full scale to reference and zero input to reference are now compared and processed to find the temperature coefficients of zero input (which will include any offset inherent in the transducer and A to D circuits) and full scale input. These temperature coefficients form the third and fourth parts of the correction data word. Finally the transducer is run through a complete range of inputs e.g. 0 p.s.i., 1 p.s.i., 2 p.s.i., etc. for a 0-30 p.s.i. absolute transducer and the ratios aquired are processed to check that the output characteristic of the transducer is linear. If it is not the data is processed further to produce the characteristics of the non-linearity curve. Almost all transducers of all types if non linear have a predictable non-linearity curve, random or unpredictable non-linearity is rare and usually indicates a faulty transducer. The characteristics of the non-linearity curve form the fifth part of the data correction word. The output of the temperature transducer at a standard temperature is now aquired from the A to D together with the reference voltage, processed to find the ratio and encoded to form the sixth part of the data correction word. This correction data word is now encoded, by means of split pads, preset switches, or links forms the storage means 107 connected to the parallel inputs of the correction data shift register chain 106 of the TU.

A preferred form of Analogue to Digital converter for use in the arrangement of FIG. 1 is shown in schematic form in FIGS. 3 and 4.

In FIG. 3 EC5 and EC12 are power lines +5v and 0v respectively. EC14 is the clock line for the shift Register 104. EC37 is the End of Conversion Signal Line.

EC13 is the Shift register serial data output line.
EC22 is a 1 kHz input line.

On power up a high level (logic "1") reset pulse is applied to the binary counter 301 via EC16. The reset pulse is approximately 16 mSec long and is not repeated i.e. EC16 remains at a lower level (logic "0") for the rest of the measurement period. The rest pulse is also fed to a Silicon Controlled Switch 302 which turns on for this period and short circuits the capacitor 303 ensuring that it is discharged to 0 volts. At the same time the reset pulse is inverted 304 and fed to another silicon controlled switch 305 which remains off for the reset period. At the end of the reset pulse EC16 returns to a low level thus turning off 302 and removing the short circuit from the capacitor 303 and via the inverter 304 turns on switch 305 connects a constant current source 306 to the positive supply and the constant current circuit 306 begins to charge capacitor 303. The voltage at the junction 309 of 306 and 303 thus begins to rise in a linear fashion. At the same time the binary counter 301 begins to count the 10 kHz pulses present at its input. These pulses are fed to the counter input via a NAND gate 308.

The rising voltage of the junction 309 is monitored by the inverting inputs of three comparators 310, 311, 312. The non inverting inputs of these comparators form three separate analogue voltage inputs each capable of measuring a separate unknown voltage. The output of each comparator is "high" (logic "1") initially and is connected via a NAND gate 313, 314, 315 which inverts the comparator output and controls the shift/load input of a serial/parallel input, serial output shift register 316, 317, 318. Each shift register 316, 317, 318 monitors the outputs of the binary counter 301 via its parallel inputs. When the rising voltage of the non inverting input of any comparator exceeds the value of the unknown voltage present on the inverting input of that comparator the output of that comparator changes from a high (logic "1") level to a low (logic "0") level. This causes the NAND GATE output 313, 314, 315 connected to that comparator to place a high (logic "1") level on the "load" input of the appropriate shift register causing it to load and store (via its parallel inputs) the value of the count reached by the binary counter 301 at that moment. The capacitor 303 value and the magnitude of the constant current in 306 are chosen so that the comparators must all change state within the maximum period provided by the counter value that is monitored by the parallel inputs of the shift registers. Thus at the end of this timing period each shift register will have stored a value which is directly proportional to the level of the analogue voltage present at the related input. A further output stage on the binary counter times out after a period greater than the measurement period and is used to inhibit further counting and to provide via EC37 an end of conversion signal. The second input of each NAND gate 313, 314, 315 is connected to the output of the inverter 307 which inverts the EOC (end of conversion signal) present on EC37 and uses it via NAND gate 308 to inhibit further counting. At the same time the EOC signal is used via NAND gates 313, 314, 315 to force any of the shift registers 316, 317, 318 that have not yet received a "load" signal (due to an overange input signal on its respective comparators analogue input) to load a zero value indicating an overrange condition.

The shift registers are connected (via their serial inputs and outputs) in series and the stored values can now be "clocked" out via EC13 as one long data word under the control of the clock pulses on EC14.

Although three analogue inputs are shown in practice a greater number of inputs could be measured simultaneously by duplicating the appropriate circuits for each input. The binary counter and shift registers shown are for an "Eight Bit" measurement but 6, 10, and 12 bit measurements could be taken by using a 6, 10 or 12 bit counter and shift registers. The count frequency is shown as 10 kHz but a higher or lower frequency could be used.

In service, each time that TU is addressed a "load" signal is applied to the correction data shift registers chain 106 and the preset value on the parallel inputs is thus loaded from the storage means 107 ready for transmission. Since the reference voltage is derived from the supply voltage applied to the transducer connected to the other analogue inputs and all inputs are measured simultaneously any variation in supply voltage will cause an equal variation (expressed as a percentage) on the reference and all transducers and the ratio of reference voltage to the unknown voltage present at any input will remain unchanged. The TU transmits the absolute values of all inputs at the time of measurement together with the Address and Data correction word. The CU decodes this and after verifying the address processes the decoded value of each input and the reference voltage and derives the ratio of each input voltage to the reference voltage. The data correction word is now decoded and provides:

1: The ratio of reference to temperature, (at standard temperature) this is now compared with the current reference to temperature value to find the current temperature.

2: The ratio of reference to full scale transducer output, this is now compared with the current reference transducer ratio to determine the current transducer output level.

3: The ratio of reference to zero input, this is processed with the reference to full scale ratio to find the value of zero (including any offset errors).

4: Temperature coefficient of zero (expressed as %/degrees C) this is used with the current temperature data to correct the value of zero. The zero value is now substracted from the current transducer output level.

5: Temperature coefficient of span (expressed as %/degrees C) which is used with the current temperature data to correct the current transducer output level.

6: Non-linearity data, the current transducer output level has by now been determined as a percentage of full scale output and the non-linearity data is used for final error correction.

Using the system and process outlined above the current input level of a remote transducer may be determined accurately despite variations in local temperature and supply voltage and corrected for its own non-linearity characteristic.

In addition, an extra shift register(s) (not shown) may be added to the data correction shift register chain 106 to enable either further correction data to be encoded or the parallel inputs may be wired to switched outputs from local (to the TU) security systems (burglar alarms, fire alarms etc.) or other measuring equipment with a digital output such as a flow totalizer or external high resolution A/D converter. In this way extra digital information local to the addressed transducer may be encoded and returned to the CU each time that TU is addressed.

I claim:

1. An addressable transducer interface in an assembly with an electrical transducer, comprising, encodable means (107) for storing correction data for the correction of errors of one or more types selected from a group comprising errors produced as changes in the operating environment of the transducer, errors produced by variations in the characteristics of the transducer, and errors characteristic of a particular class of transducer used, relating to that transducer so that on addressing of an interface by a remote control means, the correction data is transmitted to the remote control means together with measurement data from the transducer.

2. An interface as claimed in claim 1, in which said storing means is arranged to store said correction data in digital form.

3. And interface as claimed in claim 1, in which said correction data includes a unique address for an associated transducer/interface.

4. An interface as claimed in claim in which said correction data is so transmitted in serial form.

5. An interface as claimed in claim 1, in which said storing means comprises at least one shift register (106).

6. An interface as claimed in claim 5, in which a shift register is provided in the storing means for each set item.

7. An interface as claimed in claim 6, in which said shift registers are corrected in cascade whereby said items of data may be so transmitted as successive parts of a word of data in serial form.

8. An interface as claimed in claim 5, in which encodable means (107) is provided for storing said correction data and for loading that data into the, or one of the, shift registers (106).

9. An interface as claimed in claim 8, further comprising a phase locked loop circuit (100) arranged to lock to the frequency of an integrating signal from said control means to provide a local frequency standard within the interface for use in decoding an addressing signal from said control means to the interface.

10. An interface as claimed in claim 1 further comprising an analogue to digital converter circuit (104) arranged to convert an analogue output from a associated transducer to a digital signal.

11. An interface as claimed in claim 10 in combination with an associated transducer.

12. The analogue to digital converter circuit as claimed in claim 10, further comprising, means (305, 306) for changing a capacitor (303) of a given value from a source of constant current of a given value, voltage comparator means (310, 311, 312) arranged to compare the value of an analogue voltage signal on an input with the charge voltage in said capacitor, a digital counter (301) arranged to start a count of cycles of a reference frequency when charging the capacitor is commenced from zero charge, a shift register (316, 317, 318) and a loading circuit arranged to cause the instantaneous count in said counter to be loaded into said shift register at the time when the charge in said capacitor is detected by said comparator as being equal to the value of the analogue signal.

13. An analogue to digital converter is claimed in claim 12, further comprising characterised by a plurality of such shift registers with associated load circuits and comparator means each associated with a respective input and responsive to the charge voltage in said capacitor whereby a plurality of independent analogue signals may be corrected to digital values stored in said shift registers simultaneously.

14. An analogue to digital converter as claimed in claim 13, in which said shift registers are cascaded whereby the digital values stored therein may be transmitted therefrom as parts of a word of data in serial form.

15. An interface as claimed in claim 1, further comprising, an analogue to digital converter circuit means (305,306) for changing a capacitor (303) of a given value from a source of constant current of a given value, voltage comparator means (310, 311, 312) arranged to compare the value of an analogue voltage signal on an input with the charge voltage in said capacitor, a digital counter (301) arranged to start a count of cycles of a reference frequency when charging the capacitor is commenced from zero charge, a shift register (316, 317, 318) and a loading circuit arranged to cause the instantaneous count in said counter to be loaded into said shift register at the time when the charge in said capacitor is detected by said comparator as being equal to the value of the analogue signal, arranged to convert one or more analogue values from an associated transducer or its environment to a digital value.

16. An addressable interface as claimed in claim 15, characterised in that said analogue values comprise a value related to the parameter measured by the associated transducer, a value related to the ambient temperature at which the transducer is generating, and a value related to a reference voltage applied to the transducer.

17. An addressable interface as claimed in claim in which said correction data comprises a word having parts representing:
  the ratio of the maximum scale output of the transducer to the reference voltage applied to it at that maximum output,
  the ratio of the zero scale output of the transducer to the reference voltage applied to it at that zero output,
  the temperature coefficient of zero scale output
  the temperature coefficient of full scale output,
  the characteristic of the transducer output curve, and
  the output of means for measuring the ambient temperature of the transducer, at a standard temperature.

* * * * *

UNITED STATES PATENT OFFICE
CERTIFICATE OF CORRECTION

Patent No. 4,831,380  Dated May 16, 1989

Inventor(s) Christopher F. Gimblett, Sr.

It is certified that error appears in the above-identified patent and that said Letters Patent is hereby corrected as shown below:

Claim 10, line 3, change "a" to "an".

Claim 17, line 1, after "claim" insert "15".

Signed and Sealed this

Twelfth Day of December, 1989

Attest:

JEFFREY M. SAMUELS

Attesting Officer  Acting Commissioner of Patents and Trademarks